(12) United States Patent
Asai et al.

(10) Patent No.: US 6,326,556 B1
(45) Date of Patent: Dec. 4, 2001

(54) MULTILAYERED PRINTED WIRING BOARD

(75) Inventors: Motoo Asai; Akihito Nakamura, both of Ibi-gun (JP)

(73) Assignee: Ibiden Co., Ltd., Gifu (JP)

( * ) Notice: Subject to any disclaimer, the term of this patent is extended or adjusted under 35 U.S.C. 154(b) by 0 days.

(21) Appl. No.: 09/319,257

(22) PCT Filed: Dec. 13, 1996

(86) PCT No.: PCT/JP96/03655

§ 371 Date: Jun. 11, 1999

§ 102(e) Date: Jun. 11, 1999

(87) PCT Pub. No.: WO98/26639

PCT Pub. Date: Jun. 18, 1998

(51) Int. Cl.[7] .................................................. H05K 1/03
(52) U.S. Cl. .......................... 174/255; 174/261; 361/792; 361/794
(58) Field of Search .................... 174/255, 261; 361/792, 793, 794, 795

(56) References Cited

U.S. PATENT DOCUMENTS 5,061,547 * 10/1991 Plesinger et al. .................... 428/209
5,519,176 * 5/1996 Goodman et al. .................... 174/255

FOREIGN PATENT DOCUMENTS

| 54113863 | 9/1979 | (JP) . |
| 54149646 | 10/1979 | (JP) . |
| 54150675 | 11/1979 | (JP) . |
| 61106079 | 7/1986 | (JP) . |
| 3-97973 | 10/1991 | (JP) . |
| 7202359 | 8/1995 | (JP) . |
| 7321463 | 12/1995 | (JP) . |
| 9-8465 | 1/1997 | (JP) . |

OTHER PUBLICATIONS

An English Language abstract of JP 61–106079.
An English Language abstract of JP 7–321463.
An English Language abstract of JP 7–202359.
An English Language abstract of JP 3–97973.
An English Language abstract of JP 54–150675.
An English Language abstract of JP 54–149646.
An English Language abstract of Jp 54–113863.
An English Language abstract of JP 9–8465.

* cited by examiner

Primary Examiner—Jeffrey Gaffin
Assistant Examiner—José H. Alcala
(74) Attorney, Agent, or Firm—Greenblum & Bernstein P.L.C.

(57) ABSTRACT

Multilayer printed wiring board capable of effectively solving the swelling of the conductor layer resulting from residual solvent and lowering of adhesion property between a resin insulating layer and a conductor. The multilayer printed wiring board can be formed by laminating resin insulating layers and conductor layers on a substrate, wherein, among conductor layers at least constituted with signal layer and power layer, a conductor pattern of the power layer is of lattice-shaped form.

4 Claims, 2 Drawing Sheets

PRIOR ART
TOP PLAN VIEW

MULTILAYERED PRINTED WIRING BOARD

TECHNICAL FIELD

This invention relates to a multilayer printed wiring board, and more particularly it proposes a multilayer printed wiring board characterized by having a conductor pattern of a power layer arranged for supplying a current to a signal layer.

BACKGROUND ART

In a multilayer printed wiring board formed by laminating interlaminar insulating layers and conductor layers, the conductor layers are divided into a power layer, a signal layer and a shield layer in accordance with use purpose and functioned individually. Among them, the power layer is usual to be a flat conductor pattern having a large surface area.

On the other hand, the multilayer printed wiring board is produced through an additive process by alternately building up a resin insulating layer and a conductor layer on a substrate and then electrically connecting the conductor layers to each other through a viahole formed in the resin insulating layer. In the production process of such a multilayer printed wiring board, therefore, there is a tendency that a solvent is liable to be retained in the interlaminar insulating layer disposed on a lower side of the conductor layer.

For example, when an air permeable resin layer such as a resist is formed on the interlaminar insulating layer, such a residual solvent is evaporated and removed by a heat treatment such as a drying treatment conducted at a plating step or the like, so that such a solvent does not particularly cause a problem.

However, when an impermeable metal layer such as a conductor layer is formed on the interlaminar insulating layer, it is very difficult to remove the above residual solvent by evaporation. Particularly, when the power layer having a flat pattern as a conductor pattern among the conductor layers is formed on the resin insulating layer through additive process, the residual solvent is retained between the power layer and the resin insulating layer as a vapor and there is a problem easily causing so-called "swelling of conductor layer".

Further, such a "swelling of conductor layer" degrades the adhesion property between the resin insulating layer and the conductor and hence causes the lowering of the interlaminar insulating property.

It is, therefore, an object of the invention to provide a multilayer printed wiring board capable of solving the above problems resulting from the residual solvent, and to particularly propose a conductor pattern of a power layer capable of preventing the swelling of the conductor layer and effectively acting to improve the adhesion property between the resin insulating layer and the conductor.

SUMMARY OF THE INVENTION

The inventors have made various studies in order to achieve the above object and as a result the present invention relates to a multilayer printed wiring board formed by laminating resin insulating layers and conductor layers on a substrate, wherein the surface of the resin insulating layer is roughened and among conductor layers at least constituted with signal layer and power layer, a conductor pattern of the power layer is of lattice-shaped form.

In the above multilayer printed wiring board, the power layer is desirable to have such a conductor pattern that a conductor width of the lattice-shaped conductor is 100 $\mu$m~5 mm and a distance between the conductor is 100 $\mu$m~10 mm.

Also, the conductor pattern of the power layer in the multilayer printed wiring board is desirable that each corner part in a cross portion of the lattice-shaped conductor is curved.

Moreover, the resin insulating layer constituting the multilayer printed wiring board according to the invention is desirable to be formed by dispersing heat-resistant resin particles soluble in an acid or an oxidizing agent into a heat-resistant resin (or a photosensitive resin) hardly soluble in an acid or an oxidizing agent. The surface of such a resin insulating agent is roughened by removing the heat-resistant resin particles with the acid or oxidizing agent. On the other hand, when the lattice-shaped power layer is formed, the plated resist is an isolated shape surrounded with the conductors and is liable to be peeled off as it is. In this point, when the plated resist is formed on the above roughened surface, the plated resist hardly peels off even in the isolated shape and hence the reliability is ensured.

In one aspect, the present invention is directed to a multilayer printed wiring board comprising a substrate; at least one resin insulating layer and at least one conductor layer laminated on the substrate; the at least one resin insulating layer comprising a roughened surface; the at least one conductor layer comprising at least a signal layer and a power layer; and the power layer comprising a lattice-shaped conductor pattern including a conductor width of about 100 $\mu$m to 5 mm, and a distance from a conductor edge to an opposing conductor edge of about 100 $\mu$m to 10 mm.

Each corner part in a cross portion of the lattice-shaped conductor pattern can be curved.

The at least one resin insulating layer and the at least one conductor layer can comprise a plurality of insulating layers and conductor layers.

Figure 1A:
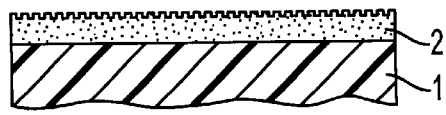
FIGS. 1A to 1E are schematic views illustrating steps of forming a power layer in a multilayer printed wiring board according to the present invention.

In this case, numeral 1 is a substrate, numeral 2 an interlaminar insulating layer, numeral 3 a permanent resist plated resist), and numeral 4 a power layer.

BEST MODE FOR CARRYING OUT THE INVENTION

The multilayer printed wiring board according to the invention lies in a point that the pattern of the conductor formed as a power layer among the conductor layers is not a full form (flat form) but is a lattice-shaped form. Thus, the solvent retained in the resin layer beneath the power layer is naturally removed from a resin portion that is a portion not forming the conductor of the power layer (between the lattice-shaped patterns), so that it is not retained beneath the power layer as it is. As a result the swelling is not caused in the power layer having the above structure, and the adhesion property of the power layer to the lower-side resin insulating layer is improved.

In the conventional power layer made from full conductor (flat pattern), when the resin insulating layer is formed on the conductor, it is necessary that at least a surface of the conductor is subjected to a roughening treatment in order to ensure the adhesion property between between the conductor and the resin insulating layer. In this connection, in the power layer provided with the lattice-shaped conductor pattern according to the invention, the resin layer is existent on a portion of the power layer not forming the conductor (between the lattice-shaped conductor patterns), so that at least a surface of this portion is not necessary to be subjected to the roughening treatment and hence it is joined to an upper-side resin insulating layer through the resin. The joint between resin and resin (same kind) is superior to the joint between resin and metal (different kind) in the adhesion property. Further, the power layer has a structure of unevenly repeating the resin portion and the lattice-shaped conductor portion and is joined to the upper-side resin insulating layer at an uneven fitted state, so that the joint strength becomes considerably high. As a result, the adhesion property between the power layer and the upper-side resin insulating layer in the multilayer printed wiring board according to the invention is considerably improved.

In such a multilayer printed wiring board according to the invention, it is desirable that the conductor pattern of the power layer has a conductor width of the lattice-shaped conductors of 100 μm~5 mm and a distance between the conductors of 100 μm~10 mm. Because, when they are less than 100 μm, the pattern formation is very difficult from a viewpoint of the production limitation. On the other hand, when the conductor width exceeds 5 mm, the residual solvent in the resin layer beneath the conductor is hardly removed, and when the conductor distance exceeds 10 mm, the area of the conductor serving as the power is considerably decreased, so that the electric properties of the power layer are degraded.

And also, the conductor pattern of the power layer is desirable that each corner part in a cross portion of the lattice-shaped conductor is curved. That is, it is desirable that each cross connecting portion is subjected to a round treatment short-cutting into a circle or an ellipsoid, Because, stress concentration (particularly produced in heat cycle) into the resin layer existing in the portion not forming the conductor of the power layer (between the lattice-shaped conductor patterns) or the plated resist (permanent resist) is prevented by such a round treatment and the occurrence of cracks in the resist can be prevented.

The conductor pattern of the power layer constituting the multilayer printed wiring board according to the invention is concretely described with reference to examples below.

EXAMPLES

Example 1

In this example, the power layer constituting the multilayer printed wiring board is formed as follows.

At first, an interlaminar insulating layer 2 made of a heat-resistant resin (PES) is formed on a substrate 1 and the surface of the interlaminar insulating layer 2 is roughened with a solution of permanganate to a roughness of Rz=6 μm according to JIS-B0601 (see FIG. 1(A)). Moreover, the interlaminar insulating layer 2 after the roughening has a thickness of 35 μm.

Figure 1B:
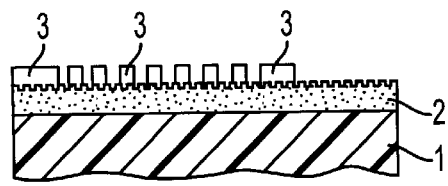
Figure 1C:
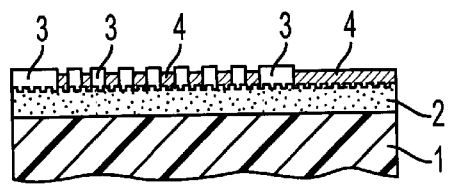
Figure 1D:
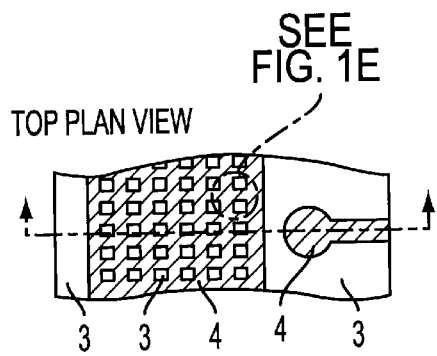
Figure 1E:
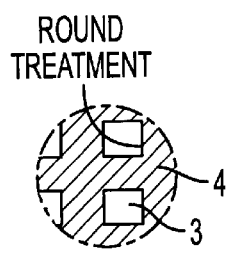

Then, a desired permanent resist (made of epoxy resin) 3 corresponding to the conductor pattern of the power layer is pattern-printed onto the surface of the interlaminar insulating layer (see FIG. 1(B)), and subjected to an electroless copper plating to form a power layer 4 having a lattice-shaped conductor pattern (see FIG. 1(C)). The lattice structure of the power layer 4 is conductor width/resist width= 250 μm/250 μm in both directions of X-axis and Y-axis.

Example 2

In this example, the power layer constituting the multilayer printed wiring board is formed as follows.

At first, an interlaminar insulating layer 2 made of a heat-resistant resin (PES- epoxy resin) is formed on a substrate 1 and the surface of the interlaminar insulating layer 2 is roughened with a solution of permanganate to a roughness of Rz=6 μm according to JIS-B0601 (see FIG. 1(A)). Moreover, the interlaminar insulating layer 2 after the roughening has a thickness of 35 μm.

Then, a desired permanent resist (made of epoxy resin) 3 corresponding to the conductor pattern of the power layer is pattern-printed onto the surface of the interlaminar insulating layer (see FIG. 1(B)), and subjected to an electroless copper plating to form a power layer 4 having a lattice-shaped conductor pattern (see FIG. 1(C)). The lattice structure of the power layer 4 is conductor width/resist width of 5 mm/10 mm in an X-axis direction and conductor width/ resist width=250 μm/250 μm in a Y-axis direction.

Example 3

In this example, the power layer constituting the multilayer printed wiring board is formed as follows.

At first, an interlaminar insulating layer 2 made of a heat-resistant resin (PES-epoxy resin) is formed on a substrate 1 and the surface of the interlaminar insulating layer 2 is roughened with a solution of permanganate to a roughness of Rz=6 μm according to JIS-B0601 (see FIG. 1(A)). Moreover, the interlaminar insulating layer 2 after the roughening has a thickness of 35 μm.

Then, a desired permanent resist (made of epoxy resin) 3 corresponding to the conductor pattern of the power layer is pattern-printed onto the surface of the interlaminar insulating layer (see FIG. 1(B)), and subjected to an electroless copper plating to form a power layer 4 having a lattice-shaped conductor pattern (see FIG. 1(C)). The lattice structure of the power layer 4 is conductor width/resist width= 250 μm/250 μm in both directions of X-axis and Y-axis. In this case, each of four corners in each lattice face surrounded by the conductor pattern is subjected to a round treatment.

Comparative Example 1

In this comparative example, the power layer constituting the multilayer printed wiring board is formed as follows.

Figure 2A:
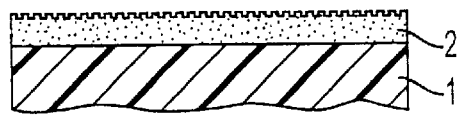
FIGS. 2A–2D are schematic views illustrating steps of forming a power layer in a conventional multilayer printed wiring board.

At first, an interlaminar insulating layer 2 made of a heat-resistant resin (PES-epoxy resin) is formed on a substrate 1 and the surface of the interlaminar insulating layer 2 is roughened with a solution of permanganate to a roughness of Rz=6 μm according to JIS-B0601 (see FIG. 2(A)). Moreover, the interlaminar insulating layer 2 after the roughening has a thickness of 35 μm.

Figure 2B:
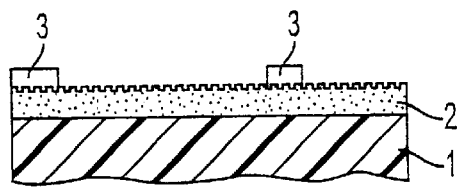
Figure 2C:
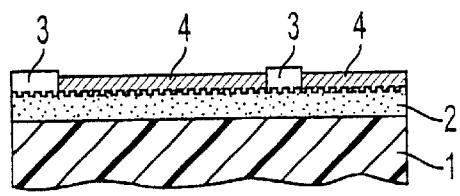
Figure 2D:
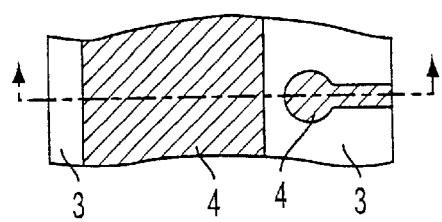

Then, a desired permanent resist (made of epoxy resin) 3 corresponding to the conductor pattern of the power layer is pattern-printed onto the surface of the interlaminar insulating layer (see FIG. 2(B)), and subjected to an electroless copper plating to form a power layer 4 having a flat pattern (see FIG. 2(C)). This flat pattern is a conductor pattern of a power layer 4 in the conventional multilayer printed wiring board and its size is 20 mm□.

Comparative Example 2

In this comparative example, the power layer constituting the multilayer printed wiring board is formed as follows.

At first, an interlaminar insulating layer 2 made of a heat-resistant resin (PES-epoxy resin) is formed on a substrate 1 and the surface of the interlaminar insulating layer 2 is roughened with a solution of permanganate to a roughness of Rz=6 μm according to JIS-B0601 (see FIG. 2(A)). Moreover, the interlaminar insulating layer 2 after the roughening has a thickness of 35 μm.

Then, a desired permanent resist (made of epoxy resin) 3 corresponding to the conductor pattern of the power layer is pattern-printed onto the surface of the interlaminar insulating layer (see FIG. 2(B)), and subjected to an electroless copper plating to form a power layer 4 having a lattice-shaped conductor pattern (see FIG. 2(C)). The lattice structure of the power layer 4 is conductor width/resist width of 50 μm/50 μm in both directions of X-axis and Y-axis.

Comparative Example 3

In this comparative example, the power layer constituting the multilayer printed wiring board is formed as follows.

At first, an interlaminar insulating layer 2 made of a heat-resistant resin (PES-epoxy resin) is formed on a substrate 1 and the surface of the interlaminar insulating layer 2 is roughened with a solution of permanganate to a roughness of Rz=6 μm according to JIS-B0601 (see FIG. 2(A)). Moreover, the interlaminar insulating layer 2 after the roughening has a thickness of 35 μm.

Then, a desired permanent resist (made of epoxy resin) 3 corresponding to the conductor pattern of the power layer is pattern-printed onto the surface of the interlaminar insulating layer (see FIG. 2(B)), and subjected to an electroless copper plating to form a power layer 4 having a lattice-shaped conductor pattern (see FIG. 2(C)). The lattice structure of the power layer 4 is conductor width/resist width of 10 mm/300 μm in both directions of X-axis and Y-axis.

With respect to the thus formed power layers, tests for reliability such as appearance observation, TCT test (test for resistance to cool-heat shock), test for adhesion strength and the like are carried out. The results are shown in Table 1.

TABLE 1

| | Conductor width/ distance between conductors (mm/mm) | | *1 Swelling after plating | *2 TCT test | *3 Test for adhesion strength |
|---|---|---|---|---|---|
| | X-axis direction | Y-axis direction | | | |
| Example 1 | 0.25/0.25 | 0.25/0.25 | none | after 900 cyc | ○ |
| Example 2 | 5/10 | 0.25/0.25 | none | after 700 cyc | ○ |
| Example 3 | 0.25/0.25 | 0.25/0.25 | none | more than 1000 cyc | ○ |
| Comparative Example 1 | no lattice | no lattice | presence | more than 1000 cyc | X |
| Comparative Example 2 | 0.05/0.05 | 0.05/0.05 | none | after 800 cyc | X |
| Comparative Example 3 | 15/0.30 | 15/0.30 | presence | after 800 cyc | X |

*1; presence or absence of swelling after the plating; visual inspection is carried out.
*2; TCT test: indicates a time of generating cracks in the resist through cool-heat cycle of −65° C." 125° C.
*3; test for adhesion strength: After the substrate is immersed in boiling water for 1 hour, it is immersed in a solder bath at 180° C. for 30 minutes, the presence or absence of swelling produced between conductor layer and insulating layer is evaluated.
○ ~ none of swelling
X ~ presence of swelling As seen from the results of this table, the power layer having the lattice-shaped conductor pattern according to the invention does not produce the "swelling," in the high-temperature treatment of subsequent step (e.g., drying at the step of the plating treatment) because the residual solvent in the resin layer beneath the conductor easily comes out. Also, when each corner of the cross portions in the lattice-shaped conductor pattern of the power layer is curved, the crack is not generated in the resist in the TCT test and the resistance to cool-heat shock is improved.

On the contrary, in the power layer having the flat pattern as shown in Comparative Example 1, the "swelling" is observed in the high temperature treatment of the subsequent step because the residual solvent in the resin layer beneath the conductor does not completely come out.

In the power layer having a lattice structure wherein both the conductor width and resist width are narrow as shown in Comparative Example 2, the developed residue of the resist is easily caused in the portion forming the conductor pattern because the resist pattern is fine, and the adhesion property to the interlaminar insulating layer beneath the conductor is poor. Also, the power layer shown in Comparative Example 2 is required to be provided with a land having a width larger than the lattice distance (conductor width) on its portion for connection from the upper layer or connection to the lower layer, so that the design becomes complicated.

Further, in the power layer having such a lattice structure that the conductor width is wider than the preferable range of the invention as shown in Comparative Example 3, the residual solvent in the resin layer beneath the conductor does not completely come out, so that the "swelling" is observed in the high temperature treatment of the subsequent step.

What is claimed is:

1. A multilayer printed wiring board comprising:

a substrate;

at least one resin insulating layer and at least one conductor layer laminated on said substrate;

said at least one resin insulating layer comprising a roughened surface;

said at least one conductor layer comprising at least a signal layer and a power layer; and said power layer comprising a lattice-shaped conductor pattern including a conductor width of about 100 μm to 5 mm, and a distance from a conductor edge to an opposing conductor edge of about 100 μm to 10 mm.

2. The multilayer printed circuit wiring board according to claim 1, wherein each corner part in a cross portion of the lattice-shaped conductor pattern is curved.

3. The multilayer printed circuit wiring board according to claim 1, wherein the at least one resin insulating layer and said at least one conductor layer comprise a plurality of insulating layers and conductor layers.

4. The multilayer printed circuit wiring board according to claim 2, wherein the at least one resin insulating layer and said at least one conductor layer comprise a plurality of insulating layers and conductor layers.

* * * * *